United States Patent
Paillet et al.

(10) Patent No.: US 7,161,439 B2
(45) Date of Patent: Jan. 9, 2007

(54) OSCILLATOR DELAY STAGE WITH ACTIVE INDUCTOR

(75) Inventors: Fabrice Paillet, Hillsboro, OR (US); Tanay Karnik, Portland, OR (US); Jianping Xu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 69 days.

(21) Appl. No.: 10/991,976

(22) Filed: Nov. 18, 2004

(65) Prior Publication Data

US 2006/0103479 A1     May 18, 2006

(51) Int. Cl.
*H03B 5/20*     (2006.01)

(52) U.S. Cl. .......................... 331/57; 331/135

(58) Field of Classification Search ................. 331/57, 331/135
See application file for complete search history.

(56) References Cited

U.S. PATENT DOCUMENTS

| | | | | |
|---|---|---|---|---|
| 5,850,163 | A * | 12/1998 | Drost et al. ................ 331/115 |
| 6,850,106 | B1 * | 2/2005 | Kunanayagam et al. .... 327/266 |
| 2002/0003452 | A1 * | 1/2002 | Mizuno et al. ................ 331/2 |
| 2002/0171497 | A1 * | 11/2002 | Forbes ........................ 331/57 |
| 2004/0070461 | A1 * | 4/2004 | Fredriksson ................ 331/135 |

OTHER PUBLICATIONS

Jafar Savoj and Behzad Razavi, "A 10-Gb/s CMOS Clock and Data Recovery Circuit", 2000 Symposium on VLSI Circuits Digest of Technical Papers, IEEE, pp. 136-139.
Afshin Rezayee and Ken Martin, "a 9-16Gb/s and Data Recovery Circuit with Three-State Phase Detector and Dual-Path Loop Architecture", 4pgs.
Seema Butala Anand and Behzad Razavi, "A CMOS Clock Recovery Circuit for 2.5-Gb/s NRZ Data", IEEE Journal of Solid-State Circuits, vol. 36, No. 3, Mar. 2001, pp. 432-439.
Jafar Savoj and Behzad Razavi, "A 10-Gb/s CMOS Clock and Data Recovery Circuit With a Half-Rate Binary Phase/Frequency Detector", IEEE Journal of Solid-State Circuits, vol. 38, No. 1, Jan. 2003, pp. 13-21.
Zafer Ozgür Gürsoy and Yusuf Leblebici, "Design and Realization of a 2.4 Gbps— 3.2 Gbps Clock and Data Recovery Circuit Using Deep-Submicron Digital CMOS Technology", 4pgs.

* cited by examiner

*Primary Examiner*—Joseph Chang
(74) *Attorney, Agent, or Firm*—Buckley, Maschoff & Talwalkar LLC

(57) ABSTRACT

According to some embodiments, a circuit includes a ring oscillator delay stage. The delay stage may include a first transistor, a second transistor, and an active inductor. A gate of the first transistor may receive a first input signal, a gate of the second transistor may receive a second input signal, a source of the second transistor may be coupled to a source of the first transistor, and the active inductor may be coupled to a drain of the first transistor.

6 Claims, 7 Drawing Sheets

US 7,161,439 B2

OSCILLATOR DELAY STAGE WITH ACTIVE INDUCTOR

BACKGROUND

A data signal may be transmitted and/or received along with an associated clock signal. The clock signal defines the bit-cell boundaries of the data signal and thereby allows a receiver to extract data from the data signal. The clock signal may be separate from the data signal or may be "embedded" within the data signal.

Clock signals may be controlled by clocking circuits that are associated with data-carrying communication links. A typical clocking circuit uses a local oscillator to generate clock signals that may be used to transmit and/or receive data. Frequencies of the generated clock signals may increase as data rates increase. For example, a 20 Gb/s/channel clock-and-data recovery circuit may require a local oscillator to generate clock signals of 10 GHz or more.

A local oscillator that is associated with a communication link is ideally capable of supporting any data rate that can be supported by the communication link and its associated transmitter and receiver. Some conventional local oscillator designs cannot efficiently achieve desired clock frequencies. For example, some of these designs occupy an unacceptable amount of die space when fabricated within an integrated circuit.

DETAILED DESCRIPTION

Figure 1:
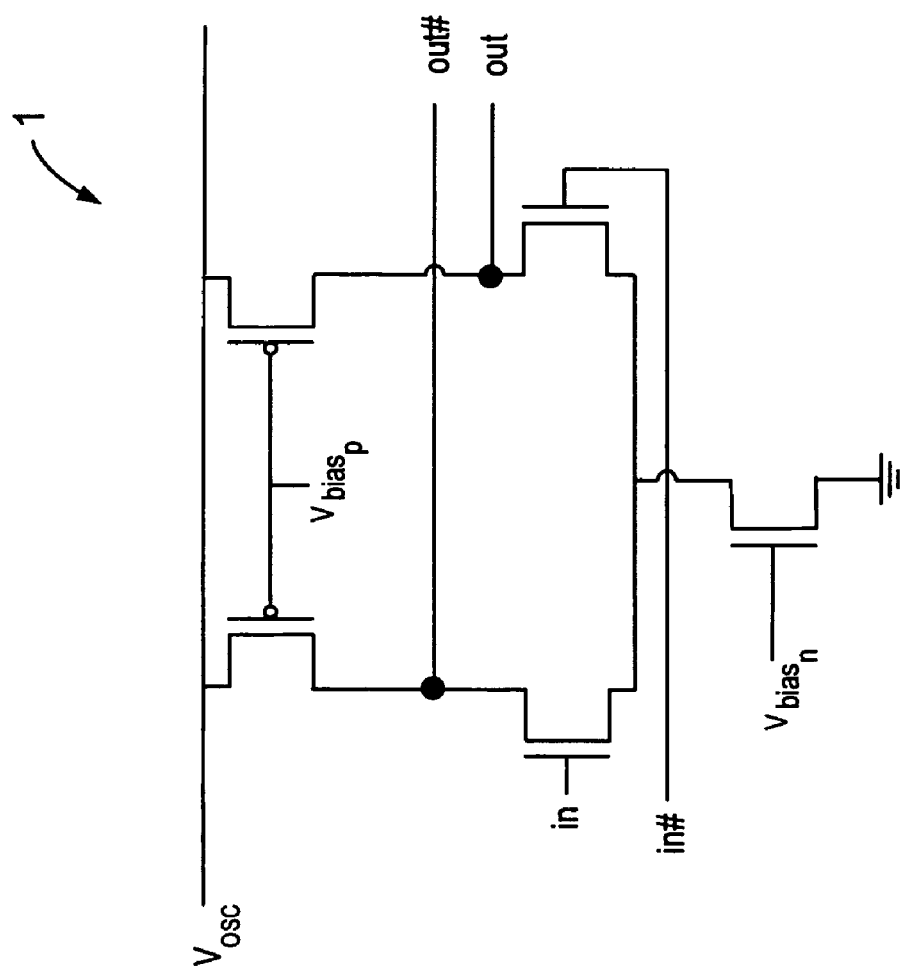
FIG. 1 is a schematic diagram of a conventional ring oscillator delay stage.

FIG. 1 illustrates a conventional differential ring oscillator delay stage. Delay stage 1 receives input signals in and in#, each of which is a component of a differential input signal. Delay stage 1 generates output signals out and out#, each of which is a component of a differential output signal.

Delay stage 1 may be coupled to one or more similar delay stages to form a ring oscillator. In particular, signals out and out# of delay stage 1 are received by a next delay stage as signals in and in#, and signals out and out# of a previous delay stage are received as signals in and in# of delay stage 1. Control signals $V_{osc}$, $Vbias_n$, $Vbias_p$ are used to control an oscillation frequency of the ring oscillator using known techniques.

Figure 2:
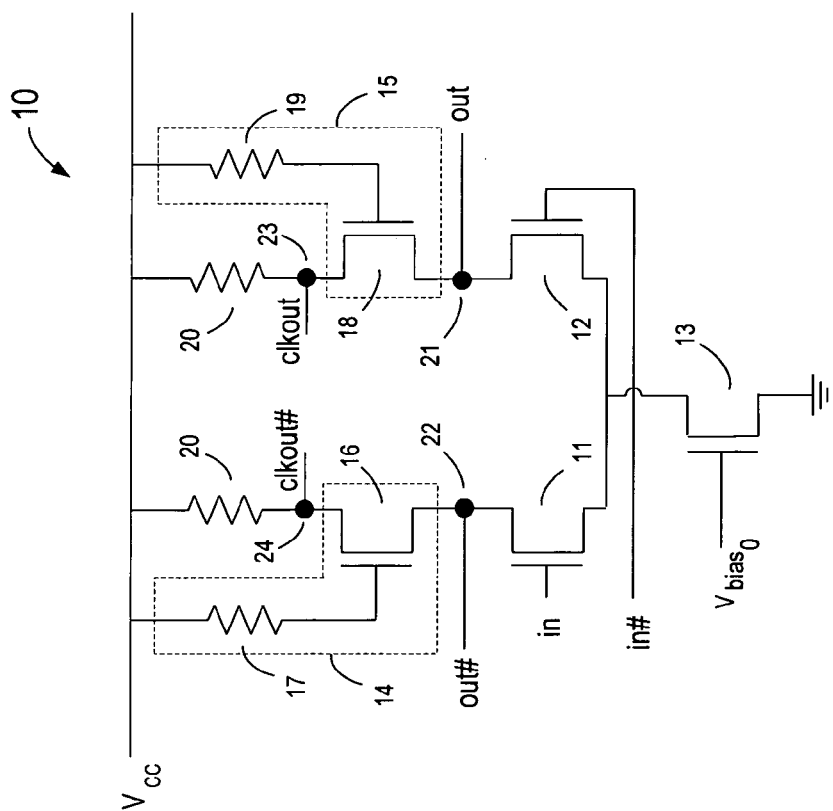
FIG. 2 is a schematic diagram of a ring oscillator delay stage according to some embodiments.

FIG. 2 is a schematic diagram of a ring oscillator delay stage according to some embodiments. Delay stage 10 comprises n-channel metal-oxide semiconductor (NMOS) transistors 11 and 12. Input signals in and in# are applied to gates of transistors 11 and 12 as shown in FIG. 2. Sources of transistors 11 and 12 are coupled to one another, and are also coupled to a drain of NMOS transistor 13. A source of transistor 13 is coupled to ground, and a gate of transistor 13 receives bias voltage $Vbias_0$. Bias voltage $Vbias_0$ may be used to control an oscillation frequency of a ring oscillator to which delay stage 10 belongs.

Active inductors 14 and 15 are coupled to respective drains of transistors 11 and 12. Active inductor 14 includes NMOS transistor 16 and resistive element 17. Resistive element 17 may comprise, for example, a fixed or variable-value resistor. Varying the value of resistive element 17 may modify a characteristic of active inductor 14 and thereby change an oscillation frequency of the ring oscillator including delay stage 10. Such frequency control may be more precise and may operate over a narrower frequency range than frequency control solely using $Vbias_0$.

A gate of transistor 16 is coupled to a first contact point of resistive element 17, and a second contact point of resistive element 17 is coupled to a supply voltage. A source of transistor 16 is coupled to the drain of transistor 11, and a drain of transistor 14 is coupled to resistor 20, which is in turn coupled to the supply voltage.

Active inductor 15 is configured similarly to active inductor 14. Active inductor 15 includes NMOS transistor 18 and resistive element 19, with a drain of transistor 15 coupled to resistive element 19, and a source coupled to a drain of transistor 12. Resistive element 19 may comprise a resistor whose value may be varied as mentioned above to change an oscillation frequency of the ring oscillator.

A first contact point of resistive element 19 is coupled to a gate of transistor 18, and a second contact point of resistive element 19 is coupled to the supply voltage. A drain of transistor 18 is coupled to resistor 20, which is in turn coupled to the supply voltage. FIG. 2 shows two instances of resistor 20, thereby indicating that each instance exhibits substantially a same resistive value, but embodiments are not limited thereto. According to some embodiments, any other type of currently- or hereafter-known active inductors may be substituted for one or both of active inductors 14 and 15.

Node 21, located at the coupling of transistors 12 and 18, provides output signal out. Node 22 provides output signal out# and is located at the coupling of transistors 11 and 16. Output signals out and out# may comprise a differential output signal. As mentioned above, output signals out and out# may be transmitted as input signals to a next delay stage of a ring oscillator that includes delay stage 10.

Node 23 is located at the drain of transistor 18 and node 24 is located at the drain of transistor 16. Node 23 provides output clock signal clkout and node 24 provides output clock signal clkout#. Signals clkout and clkout# are components of a differential signal. This differential signal may be substantially identical in frequency and phase to the differential signal composed of signals out and out#.

According to some embodiments, signals clkout and clkout# can be used to distribute a clock signal as delayed by stage 10 to other circuits. The load from these other circuits may effect the amplitude of the signals clkout and clkout#. However, the oscillation frequency of the ring oscillator to which stage 10 belongs may be effected less in this case than in a case where signals out and out# are used to distribute a clock signal to the other circuits.

Figure 3:
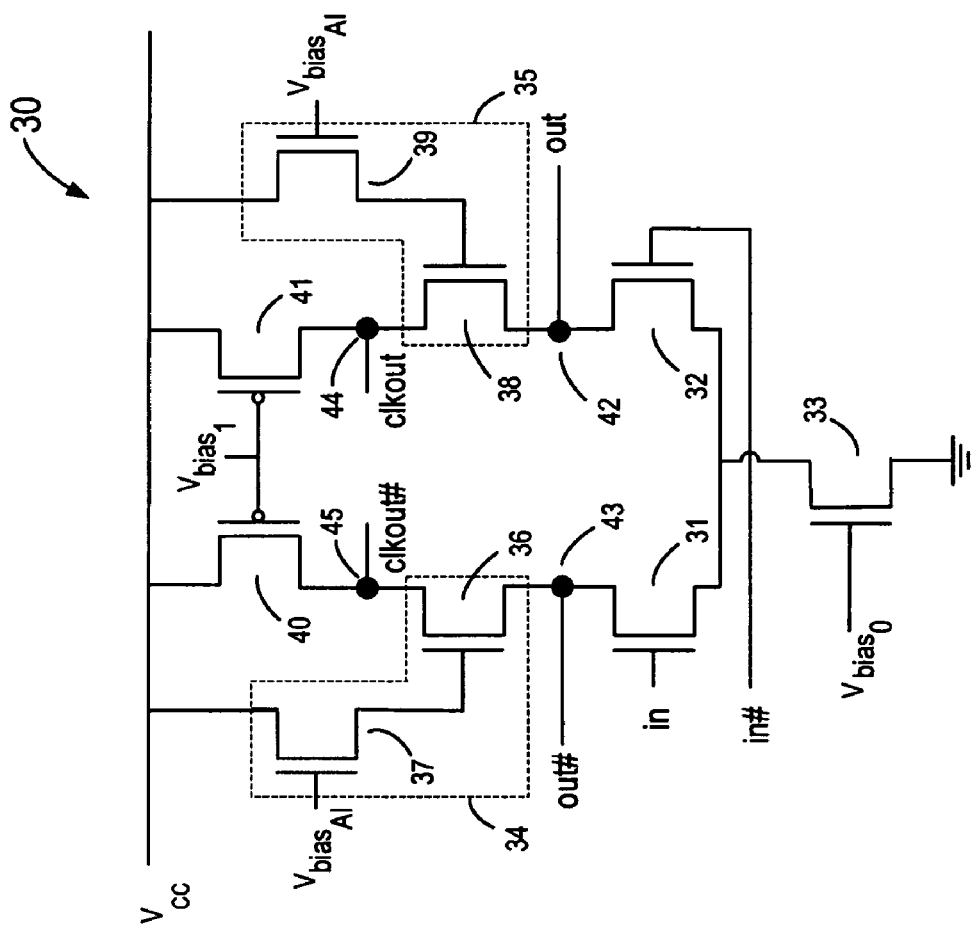
FIG. 3 is a schematic diagram of a ring oscillator delay stage according to some embodiments.

FIG. 3 is a schematic diagram of a ring oscillator delay stage according to some embodiments. Delay stage 30 comprises NMOS transistors 31 and 32. Gates of transistors 31 and 32 receive input signals in and in#. Sources of transistors 31 and 32 are coupled to one another, and are also coupled to a drain of NMOS transistor 33. A gate of transistor 33 receives bias voltage $Vbias_0$, and a source of transistor 13 is coupled to ground. Bias voltage $Vbias_0$ may be used to control an oscillation frequency of a ring oscillator to which delay stage 30 belongs.

Active inductors 34 and 35 are coupled to drains of transistors 31 and 32 as shown. Active inductor 34 comprises NMOS transistor 37 and NMOS transistor 36 in a cascode arrangement. More specifically, a source of transistor 37 is coupled to a drain of transistor 36. A drain of transistor 37 is coupled to a supply voltage, and a gate of transistor 37 is to receive control signal $Vbias_{A1}$. A drain-to-source resistance of transistor 37 may be controlled using control signal $Vbias_{A1}$. In effect, resistive element 17 of stage 10 has been substituted with transistor 37 of stage 30. Changing a value of control signal $Vbias_{A1}$ may therefore modify a characteristic of active inductor 34 and change an oscillation frequency of the ring oscillator that includes delay stage 30.

A drain of transistor 36 is coupled to a drain of p-channel metal-oxide semiconductor (PMOS) transistor 40. A source of PMOS transistor 40 is coupled to the supply voltage and a gate of transistor 40 receives signal $Vbias_1$. PMOS transistor 40 therefore functions similarly to resistor 20 of FIG. 2.

Active inductor 35 is configured similarly to active inductor 34. Active inductor 35 includes NMOS transistor 39 and NMOS transistor 38 in a cascode arrangement, with a source of transistor 38 being coupled to a drain of transistor 39. A drain of transistor 39 is coupled to a supply voltage, and a gate of transistor 39 is to receive control signal $Vbias_{A1}$. Control signal $Vbias_{A1}$ may control a drain-to-source resistance of transistor 39. In some embodiments, transistor 39 receives a control signal that is different from the control signal received by transistor 37. In either case, a characteristic of active inductor 35 and an oscillation frequency of the ring oscillator may be changed by changing a voltage applied to the gate of transistor 39.

A drain of transistor 38 is coupled to a drain of PMOS transistor 41. A source of PMOS transistor 41 is coupled to the supply voltage and a gate of transistor 41 receives signal $Vbias_1$. PMOS transistor 41 therefore functions as a variable resistor. In some embodiments, transistor 41 receives a control signal that is different from the control signal received by transistor 40.

According to some embodiments, any other type of currently- or hereafter-known active inductors may be substituted for one or both of active inductors 34 and 35.

Node 42, located at the coupling of transistors 32 and 38, provides output signal out. Node 43 provides output signal out# and is located at the coupling of transistors 31 and 36. Output signals out and out# may comprise a differential output signal, and may be transmitted as input signals to a next delay stage of a ring oscillator that includes delay stage 30.

Node 44 is located at the drain of transistor 38 and node 45 is located at the drain of transistor 36. Node 44 provides output clock signal clkout and node 45 provides output clock signal clkout#. Signals clkout and clkout# are also components of a differential signal. This differential signal may be substantially identical in frequency and phase to the differential signal composed of signals out and out#.

In some embodiments, signals clkout and clkout# can be used to distribute a clock signal as delayed by stage 30 to other circuits. The load from these other circuits may affect the amplitude of the signals clkout and clkout#. However, the oscillation frequency of the ring oscillator to which stage 30 belongs may be effected less in this case than in a case where signals out and out# are used to distribute a clock signal to the other circuits.

As mentioned above, any type of currently- or hereafter-known active inductors may be used in conjunction with some embodiments. An active device is a device that requires a source of energy for its operation. An inductor is a device characterized by the relationship $Z=j2\pi fL$. Accordingly, an active inductor is a device that requires a source of energy for its operation and that substantially exhibits characteristics governed by $Z=j2\pi fL$ over some frequency range. These characteristics need not be exhibited over all frequency ranges.

Figure 4C:
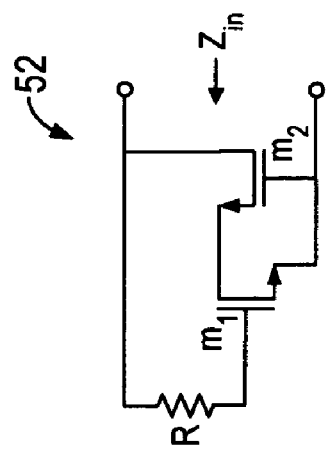
FIGS. 4a through 4c comprise diagrams of active inductors according to some embodiments.
Figure 4B:
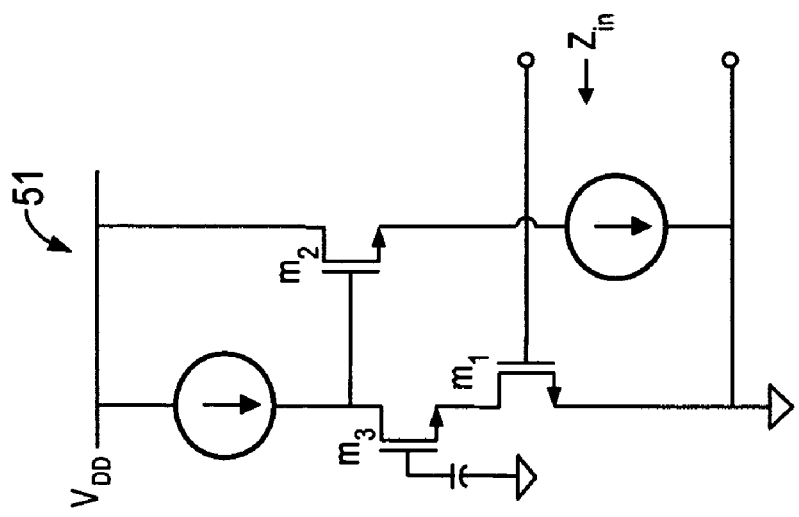
Figure 4A:
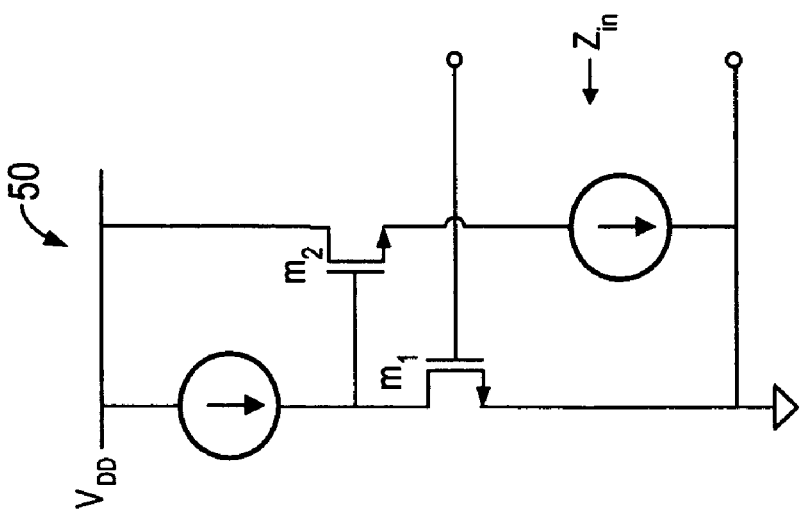

FIGS. 4a through 4c illustrate non-exclusive examples of active inductors that may be used in conjunction with some embodiments of the invention. In one specific arrangement, any of active inductors 50 through 52 may be substituted for one or more of active inductors 14, 15, 34 and 35 of FIGS. 2 and 3.

Active inductor 50 is a VHF integrated active inductor. Input impedance $Z_{in}$ of active inductor 50 is equal to $(g_{ds1}+j2\pi f(C_{gs2}+C_{gd1}+C_{gd2})/(g_{ds1}+g_{m1}+j2\pi fC_{gd2})(g_{m2}+j2\pi fC_{gs2}+C_{gd1})$. Inductor 51 of FIG. 4b represents a simple enhancement of inductor 50. The input impedance of inductor 51 is given by by $[(g_{ds1}+j2\pi f(C_{gs2}+C_{gd1}+C_{gd2}))(g_{m3}+j2\pi fC_{gs2})]/[(g_{ds1}+g_{m1}+j2\pi fC_{gd2})(g_{m2}+j2\pi fC_{gs2}+C_{gd1})(g_{m1}+j2\pi fC_{gd3})]$. Active inductor 52, in turn, provides an input impedance $Z_{in}$ that is equal to $(1+j2\pi fC_{gs1}R)/(g_{m1}+j2\pi f[C_{gs1}-C_{gs2}+2\pi f^2 C_{gs2}(C_{gs1}C_{gs2}/g_{m1}g_{m2})])$.

Figure 5:
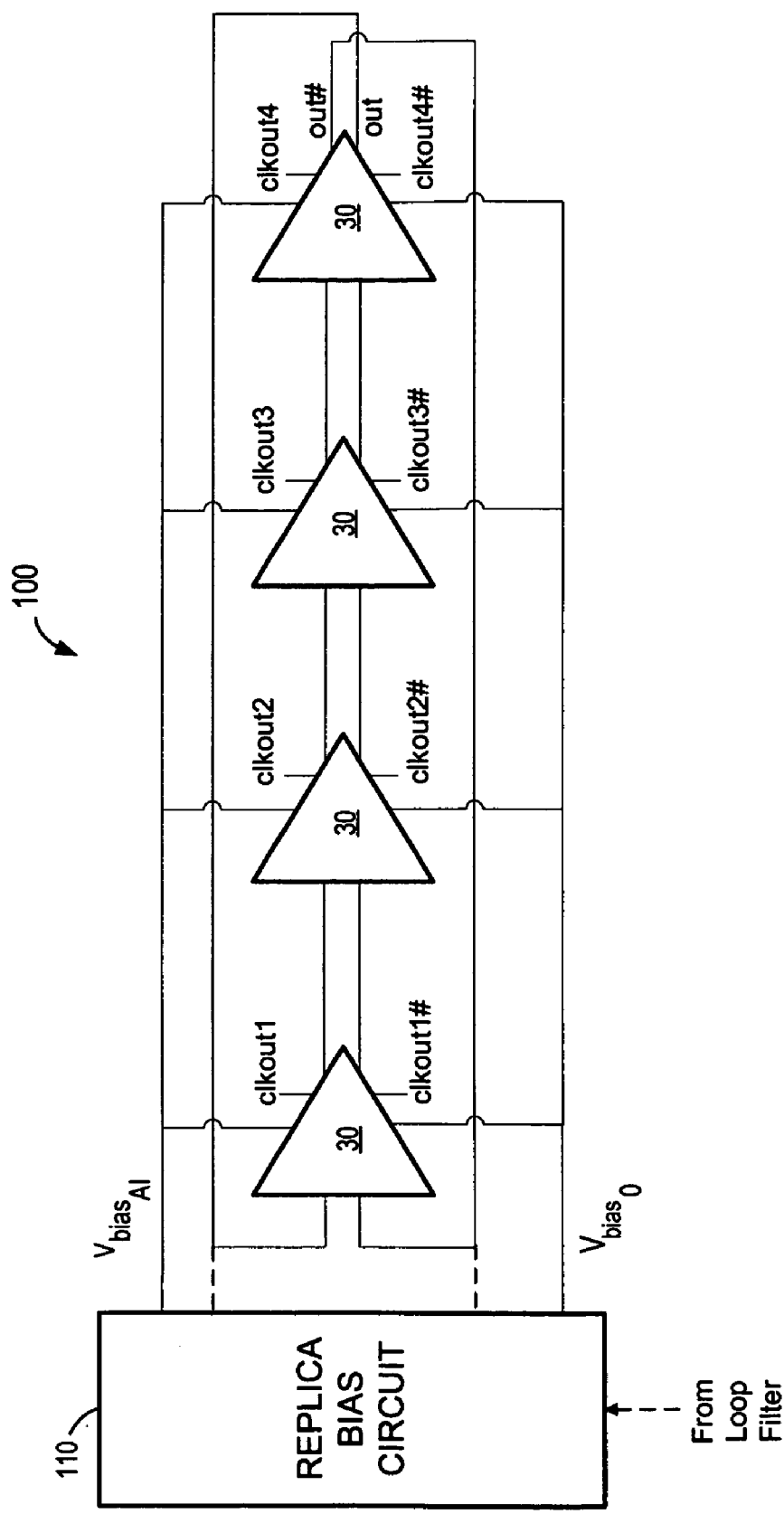
FIG. 5 is a block diagram of a ring oscillator according to some embodiments.

Some embodiments may be used in conjunction with any currently- or hereafter-known ring oscillator design. FIG. 5 illustrates one example of a ring oscillator according to some embodiments. Oscillator 100 comprises a four-stage ring oscillator. Each stage comprises delay stage 30 of FIG. 3. As described above, each instance of delay stage 30 outputs a differential signal (out, out#) to a next instance of delay stage 30 and receives a differential signal (in, in#) from a previous delay stage 30. According to FIG. 3, the differential signal (out, out#) is output from nodes 42 and 43.

Nodes 44 and 45 of each instance of delay stage 30 provide a differential clock signal, denoted by (clkout1, clkout1#), (clkout2, clkout2#), (clkout3, clkout3#), and (clkout4, clkout4#) in FIG. 5. These signals may be used to distribute a clock signal as delayed by each stage 30. For example, the differential clock signal composed of clkout2 and clkout2# may be substantially identical in frequency and delayed in phase with respect to the differential clock signal composed of clkout2 and clkout2#. According to some embodiments, the differential clock signals output by a delay stage 30 differ by 45 degrees from the differential clock signals output by adjacent delay stages 30. However, the differential clock signals output by a delay stage 30 may be substantially identical in frequency and phase to the differential signal composed of signals out and out# that is output by the delay stage 30.

The distribution of signals (clkout1, clkout1#), (clkout2, clkout2#), (clkout3, clkout3#), and (clkout4, clkout4#) may affect the amplitude of the distributed signals. However, the oscillation frequency of ring oscillator 100 may be affected less by this distribution than in a case where signals out and out# of each delay stage 30 are distributed.

Replica bias circuit 110 may be used to generate control signals $Vbias_0$ and $Vbias_{A1}$ of FIG. 5. As illustrated by dashed lines, replica bias circuit 110 may generate the signals based on a differential output signal received from delay stages 30 and/or based on a signal received from a loop filter of a phase-locked loop or a clock-and-data recovery circuit. Replica bias circuit 110 may also be used to generate control signal $Vbias_1$ (not shown) or, alternatively, resistors may be substituted for transistors 40 and 41 of delay stage 30. Ring oscillator 100 may comprise any suitable replica bias circuit 110 that is or becomes known.

Figure 6:
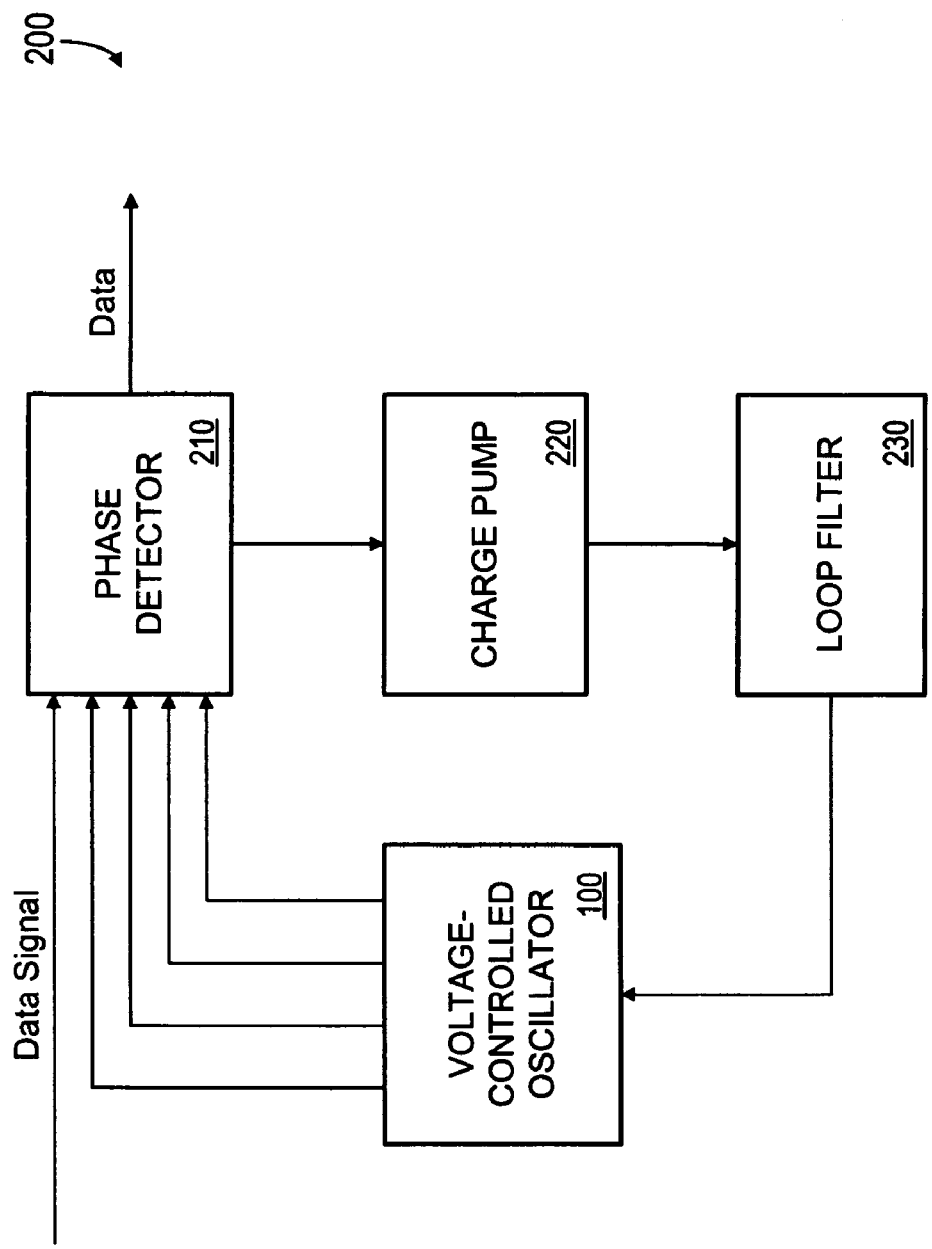
FIG. 6 is a block diagram of a clock-and-data recovery circuit according to some embodiments.

FIG. 6 comprises a block diagram of clock-and-data recovery circuit 200 including ring oscillator 100 according to some embodiments. Circuit 200 may be used to extract a clock signal from a data signal and to extract data from the data signal based on the extracted clock signal. Circuit 200 includes phase detector 210, charge pump 220, loop filter 230 and voltage-controlled oscillator 100.

Phase detector 210 receives a data signal including an embedded clock signal. Phase detector 210 also receives four differential clock signals (clkout1, clkout1#), (clkout2, clkout2#), (clkout3, clkout3#), and (clkout4, clkout4#) from oscillator 100. Phase detector 210 compares the phase of the input data signal to the differential clock signals and outputs a signal indicating the phase difference to charge pump 220. The signal is fed through charge pump 220 and loop filter 230 to oscillator 100. An oscillation frequency and/or phase of oscillator 100 is therefore controlled such that one of the four differential clock signals (clkout1, clkout1#), (clkout2, clkout2#), (clkout3, clkout3#), and (clkout4, clkout4#) matches the frequency and/or phase of the input data signal. Phase detector 210 then uses the matched differential signal to extract data from the input data signal. Embodiments maybe used in conjunction with any suitable clock-and-data recovery circuit.

Figure 7:
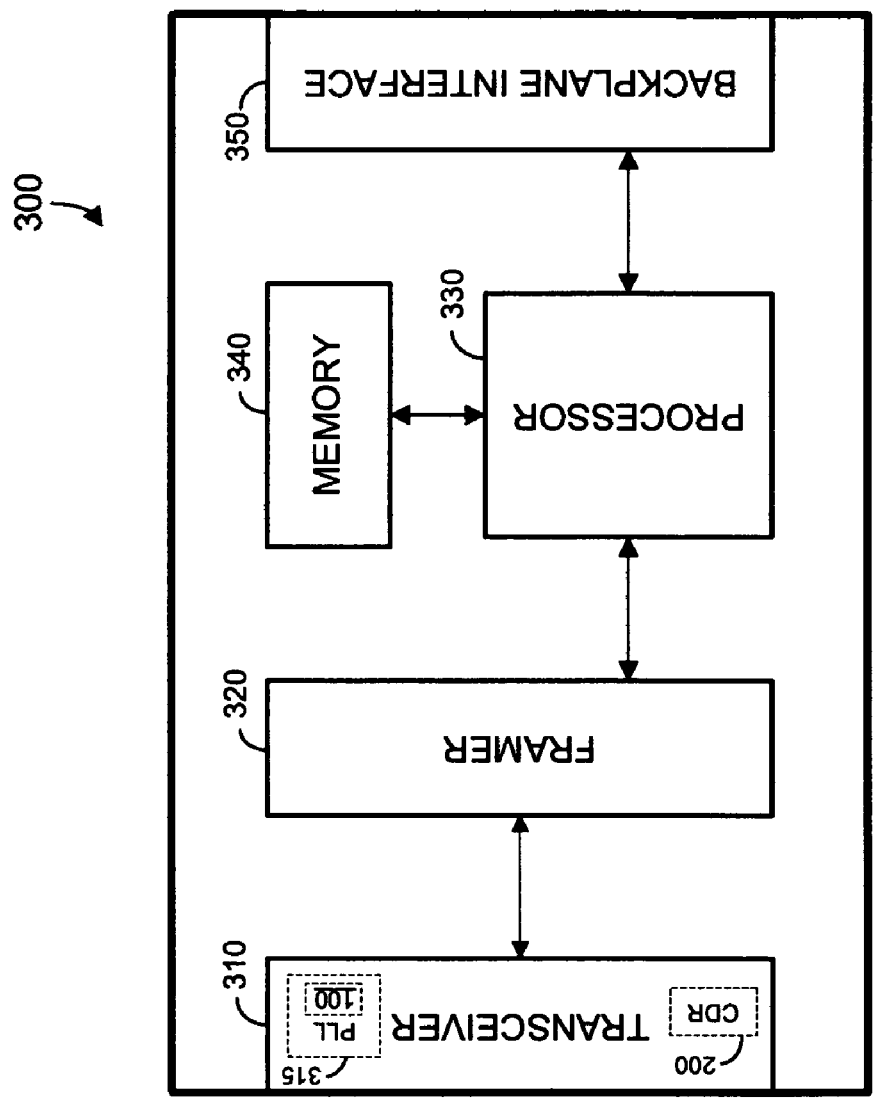
FIG. 7 is a diagram illustrating a transceiver module according to some embodiments.

FIG. 7 is a block diagram of line card 300 according to some embodiments. Line card 300 may provide an interface between a main backplane and an optical network. Line card 300 may comprise a circuit board onto which the illustrated elements are mounted. The elements include transceiver 310, framer 320, processor 330, backplane interface 340, and memory 350.

Transceiver 310 may be an optical transceiver including elements for transmitting and receiving data over an optical physical layer. A transmitting section of transceiver 310 may comprise phase-locked loop 315 utilizing ring oscillator 100 of FIG. 5. A receiving section of transceiver 310 may include a clock-and-data recovery circuit such as circuit 200 of FIG. 6. Transceiver 310 may also comprise a serial/deserializer to process outgoing/incoming data.

Framer 320 may receive and decapsulate encapsulated data that is received by the receiving section of transceiver 310. Framer 320 may also encapsulate data received from processor 330 prior to transmitting the data to transceiver 320. Processor 330 receives/transmits data from/to backplane interface 340, which communicates with a network server or a network switch backplane. Memory 350 is in communication with processor 330 and may comprise a Double Data rate Random Access Memory, a Quad Data rate Random Access Memory, or any other suitable memory. Memory 350 may store code executable by processor 330 and/or other data for use by processor 330.

The several embodiments described herein are solely for the purpose of illustration. Embodiments may include any currently or hereafter-known current sources, transistors, resistive elements and/or active inductors. Therefore, persons in the art will recognize from this description that other embodiments may be practiced with various modifications and alterations.

What is claimed is:

1. A circuit comprising:
a ring oscillator delay stage, the delay stage comprising:
 a first transistor, a gate of the first transistor to receive a first input signal;
 a second transistor, a gate of the second transistor to receive a second input signal, and a source of the second transistor coupled to a source of the first transistor; and
 an active inductor comprising a first resistive element coupled to a gate of a third transistor, the source of the third transistor coupled to a drain of the first transistor,
 wherein a first node located at a drain of the third transistor provides a first output clock signal,
 wherein a second node located at the coupling of the source of the third transistor and the drain of the first transistor provides a second signal, and
 wherein a third node located at a drain of the second transistor provides a third signal, and
a second ring oscillator delay stage, the second delay stage comprising:
 a fourth transistor, a gate of the fourth transistor coupled to the first node and to receive the second signal;
 a fifth transistor, a gate of the fifth transistor coupled to the drain of the second transistor and to receive the third signal, and a source of the fifth transistor coupled to a source of the fourth transistor; and
 a second active inductor comprising a second resistive element coupled to a gate of a sixth transistor, the source of the sixth transistor coupled to a drain of the fourth transistor,
 wherein a fourth node located at a drain of the sixth transistor provides a second output clock signal,
 wherein a fifth node located at the coupling of the source of the sixth transistor and the drain of the fourth transistor provides a fourth signal to a next ring oscillator delay stage, and
 wherein a sixth node located at the drain of the second transistor provides a fifth signal to the next ring oscillator delay stage.

2. A circuit according to claim 1, the first delay stage further comprising:
 a second resistive element coupled to a drain of the third transistor and to the first resistive element.

3. A circuit according to claim 2, wherein the second resistive element comprises a PMOS transistor.

4. A system comprising:
a transceiver to transmit and receive data comprising:
 a first ring oscillator delay stage, the delay stage comprising:
  a first transistor, a gate of the first transistor to receive a first input signal;
  a second transistor, a gate of the second transistor to receive a second input signal, and a source of the second transistor coupled to a source of the first transistor; and
  an active inductor comprising a first resistive element coupled to a gate of a third transistor, the source of the third transistor coupled to a drain of the first transistor,
  wherein a first node located at a drain of the third transistor provides a first output clock signal,
  wherein a second node located at the coupling of the source of the third transistor and the drain of the first transistor provides a second signal, and wherein a third node located at a drain of the second transistor provides a third signal, and a second ring oscillator delay stage, the second delay stage comprising:

a fourth transistor, a gate of the fourth transistor coupled to the first node and to receive the second signal;

a fifth transistor, a gate of the fifth transistor coupled to the drain of the second transistor and to receive the third signal, and a source of the fifth transistor coupled to a source of the fourth transistor; and a second active inductor comprising a second resistive element coupled to a gate of a sixth transistor, the source of the sixth transistor coupled to a drain of the fourth transistor, wherein a fourth node located at a drain of the sixth transistor provides a second output clock signal, wherein a fifth node located at the coupling of the source of the sixth transistor and the drain of the fourth transistor provides a fourth signal to a next ring oscillator delay stage, and wherein a sixth node located at the drain of the second transistor provides a fifth signal to the next ring oscillator delay stage; and a processor to process the data; and a double data rate memory in communication with the processor.

5. A method comprising:

receiving an input signal from a previous ring oscillator delay stage at a first node of a first ring oscillator delay stage;

transmitting an output signal from a second node of the first ring oscillator delay stage;

transmitting an output clock signal substantially in phase with the output signal from a third node of the first ring oscillator delay stage receiving the output signal at a third node of a second ring oscillator delay stage;

transmitting a second output signal from a fourth node of the second ring oscillator delay stage of a next ring oscillator delay stage; and transmitting an output clock signal substantially in phase with the second output signal from a fifth node of the second ring oscillator delay stage.

6. A method according to claim 5, wherein the first node is located at a gate of a first transistor, wherein the second node is located at a drain of a third transistor coupled to a drain of the first transistor.

wherein the third node is located at a gate of a third transistor, and wherein the fourth node is located at a drain of a fourth transistor coupled to a drain of the third transistor.

* * * * *